(12) United States Patent
Ho et al.

(10) Patent No.: US 11,404,609 B1
(45) Date of Patent: Aug. 2, 2022

(54) LIGHT-EMITTING MODULE

(71) Applicant: Chicony Power Technology Co., Ltd., New Taipei (TW)

(72) Inventors: Hsuan-Wei Ho, New Taipei (TW); Chen-Hao Chiu, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 0 days.

(21) Appl. No.: 17/240,963

(22) Filed: Apr. 26, 2021

(30) Foreign Application Priority Data

Jan. 27, 2021 (TW) .................................. 110103101

(51) Int. Cl.
   *H01L 33/48* (2010.01)
   *F21V 8/00* (2006.01)
   *H01L 33/58* (2010.01)

(52) U.S. Cl.
   CPC .......... *H01L 33/486* (2013.01); *G02B 6/0073* (2013.01); *H01L 33/58* (2013.01)

(58) Field of Classification Search
   CPC ...... H01L 33/486; H01L 33/58; G02B 6/0073
   See application file for complete search history.

(56) References Cited

U.S. PATENT DOCUMENTS

| | | | |
|---|---|---|---|
| 2010/0259485 A1 | 10/2010 | Chuang | |
| 2019/0172663 A1 | 6/2019 | Yeh et al. | |
| 2020/0043681 A1* | 2/2020 | Chen | G02B 6/0036 |

FOREIGN PATENT DOCUMENTS

| | | | | |
|---|---|---|---|---|
| CN | 102679204 A | * | 9/2012 | ........... G02B 6/0018 |
| CN | 103839722 A | | 6/2014 | |
| CN | 103576985 B | | 6/2016 | |
| CN | 207458813 U | | 6/2018 | |
| CN | 110335775 A | | 10/2019 | |
| CN | 211857435 U | | 11/2020 | |
| TW | 200945114 A | | 11/2009 | |
| TW | 201426408 A | | 7/2014 | |
| TW | 201426797 A | | 7/2014 | |
| TW | I474082 B | | 2/2015 | |
| TW | 202102987 A | | 1/2021 | |

* cited by examiner

*Primary Examiner* — Mary Ellen Bowman
(74) *Attorney, Agent, or Firm* — CKC & Partners Co., LLC

(57) ABSTRACT

A light-emitting module includes a light-shielding sheet, a light guide plate, a light barrier, a circuit board, and first and second light-emitting elements. The light-shielding sheet includes a first pattern area and a second pattern area. The light guide plate is disposed under the light-shielding sheet and has a microstructure disposed corresponding to the second pattern area. The light barrier is disposed under the light guide plate and has first and second holes. The circuit board is disposed under the light barrier. The first light-emitting element is disposed on the circuit board, enters the first hole, and is configured to emit light toward a bottom surface of the light guide plate. The second light-emitting element is disposed on the circuit board, passes through the second hole, and is configured to emit light toward a side surface of the light guide plate.

15 Claims, 6 Drawing Sheets

LIGHT-EMITTING MODULE

CROSS-REFERENCE TO RELATED APPLICATION

This application claims priority to Taiwan Application Serial Number 110103101, filed Jan. 27, 2021, which is herein incorporated by reference.

BACKGROUND

Technical Field

The present disclosure relates to a light-emitting module.

Description of Related Art

At present, the components used in an existing light-emitting touch panel are mainly consisted of three components, such as a light-shielding sheet, a backlight plate, and a touch circuit board, from top to bottom. After the light emitted by the light-emitting element enters the backlight plate, all the characters and graphics on the light-shielding sheet will all light up. After the light-emitting element is tuned off, no character and graphic can be seen from the light-shielding sheet. In other words, such a light-emitting touch panel can only have a full-bright display state or a full-dark display state.

To display two types of light-emitting patterns on the same light-emitting touch panel, the backlight plate needs to be changed from a single-layer structure to a double-layer structure. Correspondingly, the touch circuit board needs to be designed with two kinds of light-emitting elements to respectively emit light to enter two layers of backlight plates. However, this light-emitting touch panel can still only have a full bright display state or a full dark display state in the same layer.

Accordingly, how to provide a light-emitting module to solve the aforementioned problems becomes an important issue to be solved by those in the industry.

SUMMARY

An aspect of the disclosure is to provide a light-emitting module that can efficiently solve the aforementioned problems.

According to an embodiment of the disclosure, a light-emitting module includes a light-shielding sheet, a light guide plate, a light barrier, a circuit board, and a first light-emitting element, and a second light-emitting element. The light-shielding sheet includes a first pattern area and a second pattern area. The light guide plate is disposed under the light-shielding sheet and has a microstructure disposed corresponding to the second pattern area. The light barrier is disposed under the light guide plate and has a first hole and a second hole. The circuit board is disposed under the light barrier. The first light-emitting element is disposed on the circuit board and enters the first hole. The first light-emitting element is configured to emit light toward a bottom surface of the light guide plate. The second light-emitting element is disposed on the circuit board and passes through the second hole. The second light-emitting element is configured to emit light toward a side surface of the light guide plate.

In an embodiment of the disclosure, the first pattern area and the second pattern area are spaced apart from each other.

In an embodiment of the disclosure, the light-emitting module further includes a light-blocking board. The light-blocking board is disposed between the light-shielding sheet and the light guide plate and includes a first light transmission area. The first light transmission area is disposed corresponding to the first light-emitting element and the first pattern area.

In an embodiment of the disclosure, the light emitted by the first light-emitting element sequentially passes through the light guide plate and the first light transmission area, and then exits from the first pattern area.

In an embodiment of the disclosure, the light-blocking board further includes a second light transmission area. The second light transmission area is disposed corresponding to the microstructure and the second pattern area.

In an embodiment of the disclosure, the light emitted by the second light-emitting element is guided to the second light transmission area through the microstructure of the light guide plate and then exits from the second pattern area.

In an embodiment of the disclosure, a distance exists between the first light transmission area and the second light transmission area.

In an embodiment of the disclosure, the first pattern area partially overlaps the second pattern area.

In an embodiment of the disclosure, the light-emitting module further includes a first light-blocking bar. The first light-blocking bar is circumferentially disposed between the light barrier and the light-shielding sheet along an edge of the light-shielding sheet.

In an embodiment of the disclosure, the light-emitting module further includes a light-blocking board. The light-blocking board is disposed between the light-shielding sheet and the light guide plate and includes a first light transmission area.

In an embodiment of the disclosure, the light-emitting module further includes a light-stopping board. The light-stopping board is disposed between the light guide plate and the light barrier and includes a second light transmission area. The second light transmission area is disposed corresponding to the first light-emitting element.

In an embodiment of the disclosure, the light emitted by the first light-emitting element sequentially passes through the second light transmission area, the light guide plate, and the first light transmission area, and then exits from the first pattern area.

In an embodiment of the disclosure, the light-emitting module further includes a second light-blocking bar. The second light-blocking bar is disposed between the second light-emitting element and the light-stopping board.

In an embodiment of the disclosure, the light emitted by the second light-emitting element is guided to the first light transmission area through the microstructure of the light guide plate and then exits from the second pattern area.

Accordingly, in the light-emitting module of the present disclosure, the light emitted by the two light-emitting elements respectively enters the single light guide plate from different surfaces thereof and exits the light guide plate from different areas thereof. Therefore, the light-emitting module of the present disclosure only needs the single light guide plate to independently use the light of the two light-emitting elements to present a partial display mode except for full-bright and full-dark display modes.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
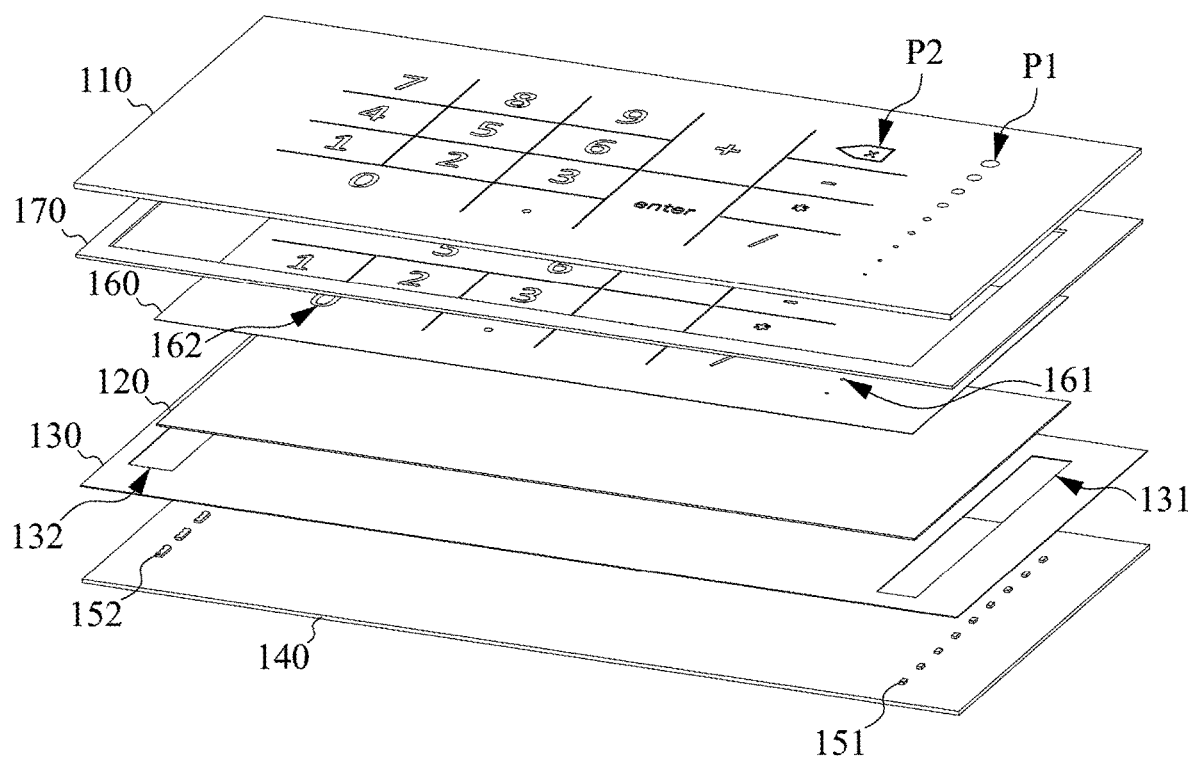
FIG. 1 is an exploded view of a light-emitting module according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Figure 2:
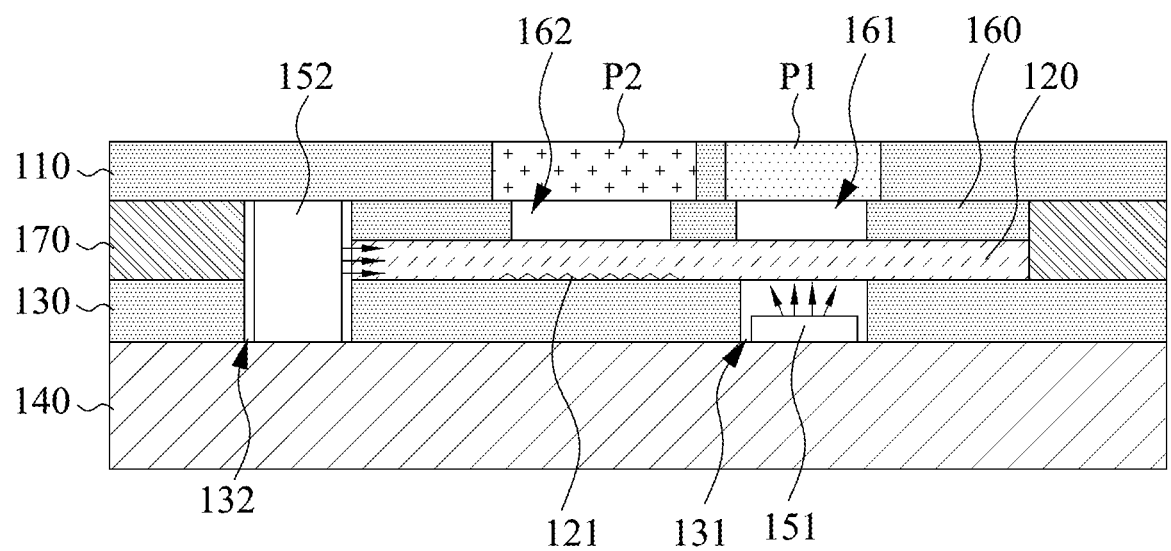
FIG. 2 is a cross-sectional view of the light-emitting module in FIG. 1 after being assembled.

Reference is made to FIGS. 1 and 2. FIG. 1 is an exploded view of a light-emitting module according to an embodiment of the disclosure. FIG. 2 is a cross-sectional view of the light-emitting module 100 in FIG. 1 after being assembled. In the present embodiment, the light-emitting module 100 includes a light-shielding sheet 110, a light guide plate 120, a light barrier 130, a circuit board 140, and a first light-emitting element 151, and a second light-emitting element 152. The light-shielding sheet 110 includes a first pattern area P1 and a second pattern area P2. The first pattern area P1 and the second pattern area P2 are spaced apart from each other. The light guide plate 120 is disposed under the light-shielding sheet 110 and has a microstructure 121. The microstructure 121 is disposed corresponding to the second pattern area P2. That is, the microstructure 121 is located right under the second pattern area P2. The light barrier 130 is disposed under the light guide plate 120 and has a first hole 131 and a second hole 132. The circuit board 140 is disposed under the light barrier 130. The first light-emitting element 151 is disposed on the circuit board 140 and enters the first hole 131. The first light-emitting element 151 emits light toward a bottom surface of the light guide plate 120. The second light-emitting element 152 is disposed on the circuit board 140 and passes through the second hole 132. The second light-emitting element 152 emits light toward a side surface of the light guide plate 120.

As shown in FIGS. 1 and 2, the light-emitting module 100 further includes a light-blocking board 160. The light-blocking board 160 is disposed between the light-shielding sheet 110 and the light guide plate 120 and includes a first light transmission area 161. The first light transmission area 161 is disposed corresponding to the first light-emitting element 151 and the first pattern area P1. That is, the first light transmission area 161 is located right under the first pattern area P1, and the first light-emitting element 151 is located right under the first light transmission area 161. Hence, after the light emitted by the first light-emitting element enters the light guide plate 120 from the bottom surface thereof, it can sequentially pass through the light guide plate 120 and the first light transmission area 161, and then exits from the first pattern area P1.

In practical applications, the area of the first light transmission area 161 may be greater than or smaller than the area of the light-emitting surface of the first light-emitting element 151. In some embodiments, the area of the first pattern area P1 is greater than the area of the first light transmission area 161.

As shown in FIG. 2, the light-blocking board 160 further includes a second light transmission area 162. A distance exists between the first light transmission area 161 and the second light transmission area 162. The second light transmission area 162 is disposed corresponding to the microstructure 121 of the light guide plate 120 and the second pattern area P2. That is, the second light transmission area 162 is located right under the second pattern area P2, and the microstructure 121 is located right under the second light transmission area 162. Hence, after the light emitted by the second light-emitting element 152 enters the light guide plate 120 from the side surface thereof, it can be guided to the first light transmission area P2 through the microstructure 121 of the light guide plate 120 and then exits from the second pattern area P2.

In some embodiments, the area of the microstructure 121 of the light guide plate 120 is greater than the area of the second light transmission area 162. In some embodiments, the area of the second pattern area P2 is greater than the area of the second light transmission area 162.

It can be seen from the foregoing structural configuration that by making the light emitted by the first light-emitting element 151 and the second light-emitting element 152 entering the single light guide plate 120 from different surfaces thereof exits the light guide plate 120 from different areas on the top surface, the light-emitting module 100 of the present embodiment can independently use the light of the first light-emitting element 151 and the second light-emitting element 152 to present a partial display mode except for full-bright and full-dark display modes. For example, the partial display mode may include turning on the first light-emitting element 151 and turning off the second light-emitting element 152 so that only the first pattern area P1 lights up, or include turning on the second light-emitting element 152 and turning off the first light-emitting element 151 so that only the second pattern area P2 lights up.

In some embodiments, the number of the first light-emitting elements 151 and the corresponding number of first light transmission areas 161 may be plural, and the aforementioned partial display mode may include turning on parts of the first light-emitting elements 151. In practical applications, the user can control the number of the first light-emitting elements 151 to be turned on as an indicator of the strength of the display state (for example, indicating the state of volume, brightness, etc.). In some embodiments, the number of the second light-emitting elements 152 can be flexibly increased or decreased according to actual demand.

In some embodiments, the material of the light barrier 130 includes plastics, but the disclosure is not limited in this regard. In some embodiments, the aforementioned plastics include polycarbonate (PC), but the disclosure is not limited in this regard.

In some embodiments, the material of the light-blocking board 160 includes plastics, but the disclosure is not limited in this regard. In some embodiments, the aforementioned plastics include polyethylene terephthalate (PET), but the disclosure is not limited in this regard. In some embodiments, the light-blocking board 160 achieves the effect of blocking light by printing a black material thereon, and the unprinted part forms the aforementioned first light transmission area 161 and the second light transmission area 162.

In some embodiments, the material of the light-shielding sheet 110 includes glass or plastics, but the disclosure is not limited in this regard. In some embodiments, the aforementioned plastics include polyester resin (Mylar), but the disclosure is not limited in this regard.

Figure 3:
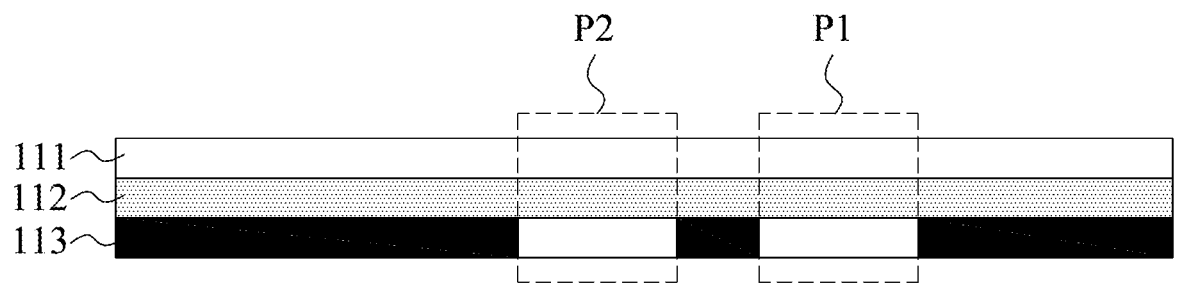
FIG. 3 is a cross-sectional view of a light-shielding sheet according to an embodiment of the disclosure.

Reference is made to FIG. 3. FIG. 3 is a cross-sectional view of the light-shielding sheet 110 according to an embodiment of the disclosure. As shown in FIG. 3, in the present embodiment, the light-shielding sheet 110 includes a base layer 111, a semi-transmissive layer 112, and an opaque layer 113. In some embodiments, the semi-transmissive layer 112 can be formed by coating a semi-transmissive ink on the bottom surface of the base layer 111 by a coating process. In some embodiments, the semi-transmissive layer 112 covers the entire bottom surface of the base layer 111, but the disclosure is not limited in this regard. In some embodiments, a light-shielding ink can be applied to the side of the semi-transmissive layer 112 away from the base layer 111 by a coating process to form the opaque layer 113. The opaque layer 113 has a hollowed-out area (that is, an uncoated area). With the foregoing configuration, the light reaching the light-shielding sheet 110 from below will leave the light-shielding sheet 110 after passing through the hollowed-out area in the opaque layer 113, the semi-transmissive layer 112, and the base layer 111 sequentially. The area where the user can see the light emitted by the first light-emitting element 151 above the light-shielding sheet 110 is the aforementioned first pattern area P1, and the area where the user can see the light emitted by the second light-emitting element 152 above the light-shielding sheet 110 is the aforementioned second pattern area P2.

In some embodiments, the base layer 111 is a soda lime glass layer, but the disclosure is not limited in this regard.

In some embodiments, at least one of the first light-emitting element 151 and the second light-emitting element 152 is a light-emitting diode, but the disclosure is not limited in this regard. In some embodiments, as shown in FIG. 2, the first light-emitting element 151 is a direct type light-emitting diode, and the second light-emitting element 152 is an edge type light-emitting diode.

As shown in FIGS. 1 and 2, the light-emitting module 100 further includes a first light-blocking bar 170. The first light-blocking bar 170 is circumferentially disposed between the light barrier 130 and the light-shielding sheet 110 along an edge of the light-shielding sheet 110. The second light-emitting element 152 is within an inner edge of the first light-blocking bar 170. Hence, the light emitted by the second light-emitting element 152 can be prevented from leaking from the edge of the light-emitting module 100.

Figure 4:
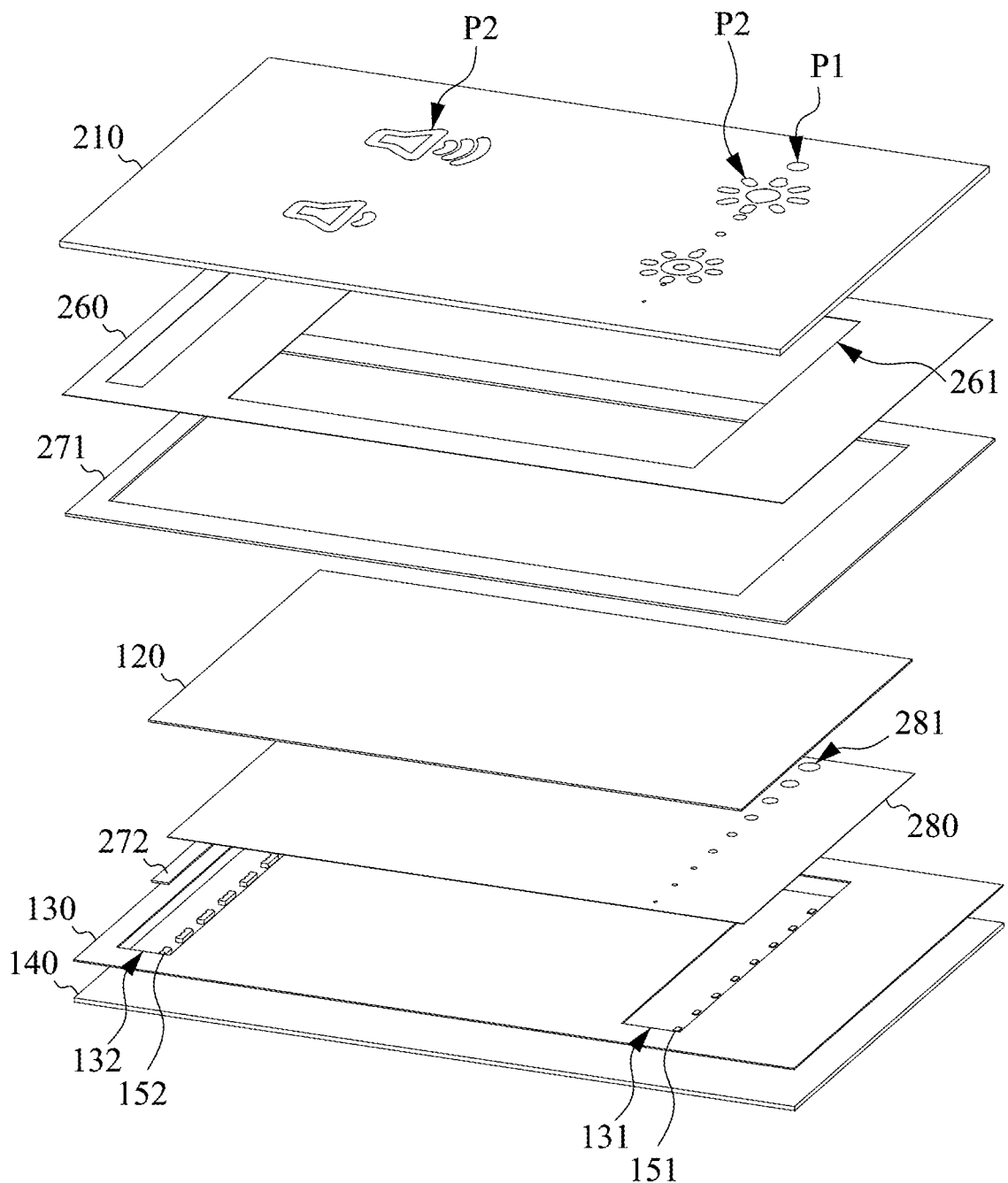
FIG. 4 is an exploded view of a light-emitting module according to another embodiment of the disclosure.
Figure 5:
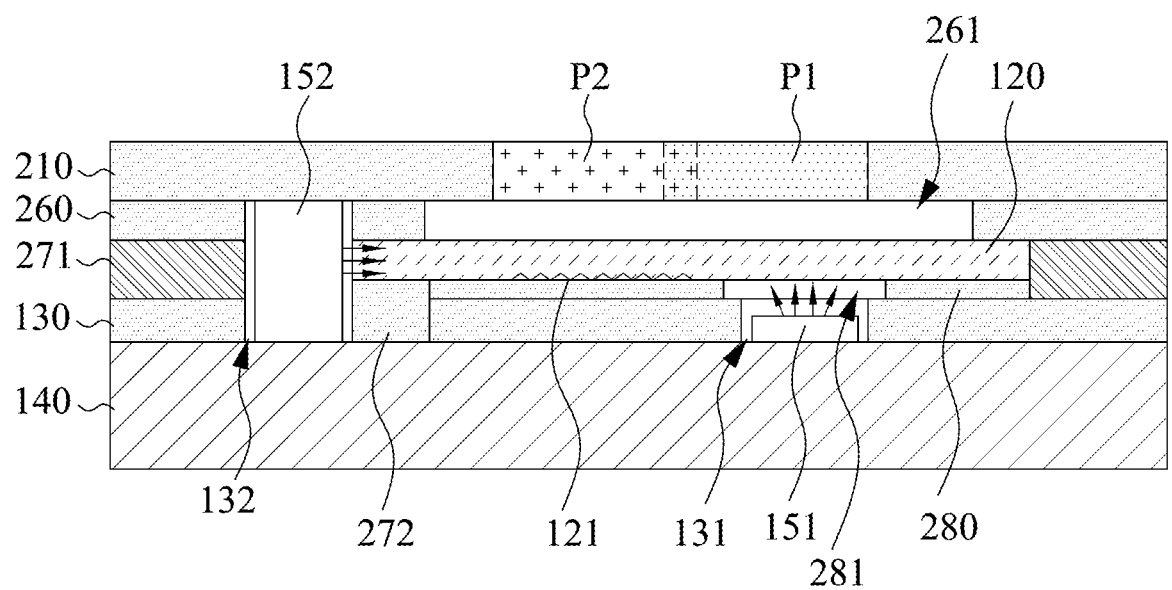
FIG. 5 is a cross-sectional view of the light-emitting module in FIG. 4 after being assembled.

Reference is made to FIGS. 4 and 5. FIG. 4 is an exploded view of a light-emitting module 200 according to another embodiment of the disclosure. FIG. 5 is a cross-sectional view of the light-emitting module 200 in FIG. 4 after being assembled. In the present embodiment, the light-emitting module 200 includes a light-shielding sheet 210, a light guide plate 120, a light barrier 130, a circuit board 140, a first light-emitting element 151, a second light-emitting element 152, and a light-blocking board 260, in which the light guide plate 120, the light barrier 130, the circuit board 140, the first light-emitting element 151, and the second light-emitting element 152 are the same as or similar to those in the embodiment shown in FIG. 2, therefore, reference may be made to the above related descriptions and will not be repeated here. The light-blocking board 260 is disposed between the light-shielding sheet 210 and the light guide plate 120.

Similar to the light-shielding sheet 110 in FIG. 2, the light-shielding sheet 210 in this embodiment may also include the base layer 111, the semi-transmissive layer 112, and the opaque layer 113 as shown in FIG. 3, but the design of the hollowed-out area in the opaque layer 113 may be different. A difference between this embodiment and the embodiment shown in FIG. 2 is that the first pattern area P1 and the second pattern area P2 of the light-shielding sheet 210 in this embodiment partially overlap. It should be noted that the area where the user can see the light emitted by the first light-emitting element 151 above the light-shielding sheet 210 is the first pattern area P1, and the area where the user can see the light emitted by the second light-emitting element 152 above the light-shielding sheet 210 is the second pattern area P2. How the light emitted by the first light-emitting element 151 and the second light-emitting element 152 respectively exits from the first pattern area P1 and the second pattern area P2 will be described below.

Another difference between this embodiment and the embodiment shown in FIG. 2 is that the light-blocking board 260 only includes the first light transmission area 261. Hence, after the light emitted by the second light-emitting element 152 enters the light guide plate 120 from the side surface thereof, it can be guided to the first light transmission area 261 through the microstructure 121 of the light guide plate 120 and then exit from the second pattern area P2.

In some embodiments, the area of the second pattern area P2 is smaller than the area of the first light transmission area 261. In some embodiments, the area of the second pattern area P2 is larger than the area of the microstructure 121 of the light guide plate 120.

In some embodiments, as shown in FIG. 5, the second light-emitting element 152 has a greater height, and the light-blocking board 260 has a hole for the second light-emitting element 152 to pass into, thereby avoiding light leakage. In some other embodiments, the second light-emitting element 152 has a smaller height, and the light-blocking board 260 covers the top surface of the second light-emitting element 152.

In addition, another difference between this embodiment and the embodiment shown in FIG. 2 is that the light-emitting module 200 of this embodiment further includes a light-stopping board 280. The light-stopping board 280 is disposed between the light guide plate 120 and the light barrier 130 and includes a second light transmission area 281. The second light transmission area 281 is disposed corresponding to the first light-emitting element 151. That is, the first light-emitting element 151 is located right under the second light transmission area 281. Hence, the light emitted by the first light-emitting element 151 can sequentially pass through the second light transmission area 281, the light guide plate 120, and the first light transmission area 261, and then exit from the first pattern area P1.

In practical applications, the area of the second light transmission area 281 may be greater than or smaller than the area of the light-emitting surface of the first light-emitting element 151. In some embodiments, the area of the first pattern area P1 is larger than the area of the second light transmission area 281.

Another difference between this embodiment and the embodiment shown in FIG. 2 is that the light-emitting module 200 of this embodiment further includes a first light-blocking bar 271. The first light-blocking bar 271 is circumferentially disposed between the light barrier 130 and the light-blocking board 260 along an edge of the light-shielding sheet 210. The second light-emitting element 152 is within an inner edge of the first light-blocking bar 271. Hence, the light emitted by the second light-emitting element 152 can be prevented from leaking from the edge of the light-emitting module 200.

Another difference between this embodiment and the embodiment shown in FIG. 2 is that the light-emitting module 200 of this embodiment further includes a second light-blocking bar 272. The second light-blocking bar 272 is disposed between the second light-emitting element 152 and at least one of the light-stopping board 280 and a part of the light barrier 130. Hence, the light emitted by the second light-emitting element 152 can be prevented from entering the light-stopping board 280.

In some embodiments, the material of at least one of the light-blocking board 260 and the light-stopping board 280 includes plastics, but the disclosure is not limited in this regard. In some embodiments, the aforementioned plastics include polyethylene terephthalate (PET), but the disclosure is not limited in this regard. In some embodiments, the light-blocking board 260 achieves a light blocking effect by printing a black material thereon, and the unprinted part forms the aforementioned first light transmission area 261. In some embodiments, the light-stopping board 280 achieves the effect of blocking light by printing a black material thereon, and the unprinted part forms the aforementioned second light transmission area 281.

Figure 6:
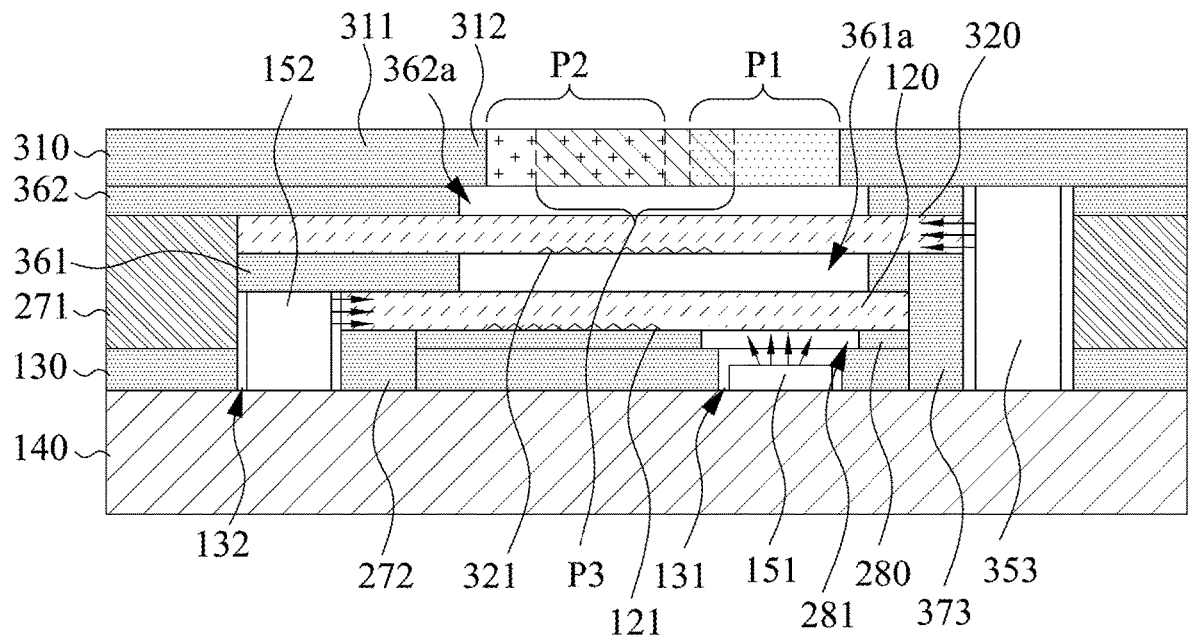
FIG. 6 is a cross-sectional view of a light-emitting module according to another embodiment of the disclosure.

Reference is made to FIG. 6. FIG. 6 is a cross-sectional view of a light-emitting module 300 according to another embodiment of the disclosure. In the present embodiment, the light-emitting module 300 includes a light-shielding sheet 310, a light guide plate 120, a light barrier 130, a circuit board 140, a first light-emitting element 151, a second light-emitting element 152, a light-blocking board 361, a first light-blocking bar 271, and a second light-blocking bar 272, in which the light guide plate 120, the light barrier 130, the circuit board 140, the first light-emitting element 151, the second light-emitting element 152, the first light-blocking bar 271, and the second light-blocking bar 272 are the same as or similar to those in the embodiment shown in FIG. 5, therefore, reference may be made to the above related descriptions and will not be repeated here. Compared with the light-blocking board 260 shown in FIG. 5, the light-blocking board 361 in this embodiment covers the top surface of the second light-emitting element 152. The light-blocking board 361 has a first light transmission area 361a.

Similar to the light-shielding sheet 210 in FIG. 5, the light-shielding sheet 310 in this embodiment may also include the base layer 111, the semi-transmissive layer 112, and the opaque layer 113 as shown in FIG. 3, but the design of the hollowed-out area in the opaque layer 113 may be different. A difference between this embodiment and the embodiment shown in FIG. 4 is that at least two of the first pattern area P1, the second pattern area P2, and the third pattern area P3 of the light-shielding sheet 310 in this embodiment partially overlap. It should be noted that the area where the user can see the light emitted by the first light-emitting element 151 above the light-shielding sheet 310 is the first pattern area P1, the area where the user can see the light emitted by the second light-emitting element 152 above the light-shielding sheet 310 is the second pattern area P2, and the area where the user can see the light emitted by a third light-emitting element 353 above the light-shielding sheet 310 is the third pattern area P3. How the light emitted by the first light-emitting element 151, the second light-emitting element 152, and the third light-emitting element 353 respectively exits from the first pattern area P1, the second pattern area P2, and the third pattern area P3 will be described below.

As shown in FIG. 6, the light-emitting module 300 of the present embodiment further includes a light guide plate 320, a light-blocking board 362, and the third light-emitting element 353. The light guide plate 320 is disposed between the light-shielding sheet 310 and the light-blocking board 361 and is in contact with the light-blocking board 361. The light guide plate 320 includes a microstructure 321. The microstructure 321 is disposed corresponding to the third pattern area P3. That is, the microstructure 321 is located right under the third pattern area P3. The light-blocking board 362 is disposed between the light-shielding sheet 310 and the light guide plate 320 and has a third light transmission area 362a. The third light-emitting element 353 is disposed on the circuit board 140 and passes through the light barrier 130. The third light-emitting element 353 emits light toward a side surface of the light guide plate 320. Hence, after the light emitted by the third light-emitting element 353 enters the light guide plate 120 from the side surface thereof, it can be guided to the third light transmission area 362a through the microstructure 321 of the light guide plate 320 and then exit from the third pattern area P3. In some embodiments, the area of the third pattern area P3 is greater than the area of the microstructure 321 of the light guide plate 320.

In addition, the light emitted by the first light-emitting element 151 can sequentially pass through the second light transmission area 281, the light guide plate 120, the first light transmission area 361a, the light guide plate 320, and the third light transmission area 362a, and then exit from the first pattern area P1. After the light emitted by the second light-emitting element 152 enters the light guide plate 120 from the side surface thereof, it can be guided to the first light transmission area 361a through the microstructure 121 of the light guide plate 120 and pass through the light guide plate 320 and the third light transmission area 362a of the light-blocking board 362 sequentially before exiting from the second pattern area P2.

In some embodiments, the third light-emitting element 353 is a light-emitting diode, but the disclosure is not limited in this regard. In some embodiments, as shown in FIG. 6, the third light-emitting element 353 is an edge type light-emitting diode.

In some embodiments, as shown in FIG. 6, the third light-emitting element 353 has a greater height, and the light-blocking board 362 has a hole for the third light-emitting element 353 to pass into, thereby avoiding light leakage. In some other embodiments, the third light-emitting element 353 has a smaller height, and the light-blocking board 362 covers the top surface of the third light-emitting element 353.

As shown in FIG. 6, the first light-blocking bar 271 is circumferentially disposed between the light barrier 130 and the light-blocking board 362 along an edge of the light-shielding sheet 310. The second light-emitting element 152 and the third light-emitting element 353 are within an inner edge of the first light-blocking bar 271. Hence, the light emitted by the second light-emitting element 152 and the third light-emitting element 353 can be prevented from leaking from the edge of the light-emitting module 300.

Another difference between this embodiment and the embodiment shown in FIG. 5 is that the light-emitting module 300 of this embodiment further includes a third light-blocking bar 373. The third light-blocking bar 373 is disposed between the third light-emitting element 353 and at least one of the light-stopping board 280, a part of the light barrier 130, the light guide plate 120, and the light-blocking board 361. The third light-blocking bar 373 is further disposed between the circuit board 140 and the light guide plate 320. Hence, the light emitted by the third light-emitting element 353 can be prevented from entering the light guide plate 120.

Under the foregoing structural configuration, the aforementioned partial display mode may include turning on one or two of the first light-emitting element 151, the second light-emitting element 152, and the third light-emitting element 353, so that one or two of the first pattern area P1, the second pattern area P2, and the third pattern area P3 light up.

In some embodiments, the material of at least one of the light-blocking boards 361 and 362 includes plastics, but the disclosure is not limited in this regard. In some embodiments, the aforementioned plastics include polyethylene terephthalate (PET), but the disclosure is not limited in this regard. In some embodiments, the light-blocking board 361 achieves a light blocking effect by printing a black material thereon, and the unprinted part forms the aforementioned first light transmission area 361a. In some embodiments, the light-blocking board 362 achieves the effect of blocking light by printing a black material thereon, and the unprinted part forms the aforementioned third light transmission area 362a.

In some embodiments, the number of third light-emitting elements 353 can be flexibly increased or decreased according to actual needs.

According to the foregoing recitations of the embodiments of the disclosure, it can be seen that in the light-emitting module of the present disclosure, the light emitted by the two light-emitting elements respectively enters the single light guide plate from different surfaces thereof and exits the light guide plate from different areas thereof. Therefore, the light-emitting module of the present disclosure only needs the single light guide plate to independently use the light of the two light-emitting elements to present a partial display mode except for full-bright and full-dark display modes.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light-emitting module, comprising:
   a light-shielding sheet comprising a first pattern area and a second pattern area;
   a light guide plate disposed under the light-shielding sheet and having a microstructure disposed corresponding to the second pattern area;
   a light barrier disposed under the light guide plate and having a first hole and a second hole;
   a circuit board disposed under the light barrier;
   a first light-emitting element disposed on the circuit board and entering the first hole, wherein the first light-emitting element is configured to emit light toward a bottom surface of the light guide plate; and
   a second light-emitting element disposed on the circuit board and passing through the second hole, wherein the second light-emitting element is configured to emit light toward a side surface of the light guide plate.

2. The light-emitting module of claim 1, wherein the first pattern area and the second pattern area are spaced apart from each other.

3. The light-emitting module of claim 2, further comprising:
   a light-blocking board disposed between the light-shielding sheet and the light guide plate and comprising a first light transmission area, wherein the first light transmission area is disposed corresponding to the first light-emitting element and the first pattern area.

4. The light-emitting module of claim 3, wherein the light emitted by the first light-emitting element sequentially passes through the light guide plate and the first light transmission area, and then exits from the first pattern area.

5. The light-emitting module of claim 3, wherein the light-blocking board further comprises a second light transmission area disposed corresponding to the microstructure and the second pattern area.

6. The light-emitting module of claim 5, wherein the light emitted by the second light-emitting element is guided to the second light transmission area through the microstructure of the light guide plate and then exits from the second pattern area.

7. The light-emitting module of claim 5, wherein a distance exists between the first light transmission area and the second light transmission area.

8. The light-emitting module of claim 2, further comprising:
   a first light-blocking bar circumferentially disposed between the light barrier and the light-shielding sheet along an edge of the light-shielding sheet.

9. The light-emitting module of claim 1, wherein the first pattern area partially overlaps the second pattern area.

10. The light-emitting module of claim 9, further comprising:
    a first light-blocking bar circumferentially disposed between the light barrier and the light-shielding sheet along an edge of the light-shielding sheet.

11. The light-emitting module of claim 9, further comprising:
    a light-blocking board disposed between the light-shielding sheet and the light guide plate and comprising a first light transmission area.

12. The light-emitting module of claim 11, further comprising:
    a light-stopping board disposed between the light guide plate and the light barrier and comprising a second light transmission area, wherein the second light transmission area is disposed corresponding to the first light-emitting element.

13. The light-emitting module of claim 12, wherein the light emitted by the first light-emitting element sequentially passes through the second light transmission area, the light guide plate, and the first light transmission area, and then exits from the first pattern area.

14. The light-emitting module of claim 12, further comprising:
    a second light-blocking bar disposed between the second light-emitting element and the light-stopping board.

15. The light-emitting module of claim 11, wherein the light emitted by the second light-emitting element is guided to the first light transmission area through the microstructure of the light guide plate and then exits from the second pattern area.

* * * * *